United States Patent
Lu et al.

(10) Patent No.: US 6,662,431 B1
(45) Date of Patent: Dec. 16, 2003

(54) ELECTRONIC SURFACE MOUNT PACKAGE

(75) Inventors: Peter Lu, Flower Mound, TX (US); Jeffrey Heaton, Cupertino, CA (US); James W. Heaton, Los Altos, CA (US); Peter Loh Hang Pao, Kowloon (HK); Robert Loke Hang Lam, Kowloon (HK); Tsang Kei Sun, Kowloon (HK)

(73) Assignee: Halo Electronics, Inc., Mt. View, CA (US)

( * ) Notice: Subject to any disclaimer, the term of this patent is extended or adjusted under 35 U.S.C. 154(b) by 0 days.

(21) Appl. No.: 10/072,309

(22) Filed: Feb. 5, 2002

Related U.S. Application Data

(63) Continuation of application No. 08/906,952, filed on Aug. 6, 1997, now Pat. No. 6,344,785.

(51) Int. Cl.[7] ................................................ H01F 7/06
(52) U.S. Cl. .......................... 29/602.1; 29/606; 336/192
(58) Field of Search ................................. 336/192, 229, 336/65, 96; 29/602.1, 605, 606

(56) References Cited

U.S. PATENT DOCUMENTS

| | | | |
|---|---|---|---|
| 3,721,747 A | | 3/1973 | Renskers |
| 4,687,898 A | * | 8/1987 | Riordan et al. ........... 219/56.22 |
| 4,800,346 A | * | 1/1989 | Muramatsu et al. ........ 333/140 |
| 5,034,854 A | | 7/1991 | Matsumura et al. |

FOREIGN PATENT DOCUMENTS

| | | |
|---|---|---|
| EP | 0 490 438 A1 | 6/1992 |

OTHER PUBLICATIONS

McCormick, Surface Mount Transformers: A New Packing Approach, Feb. 1993, pp. 27, 30–31.*
Mc Cormick; Surface Mount Transformers; A New Packaging Approach; Surface Mount Technology; Feb. 1993; pp. 27–31.
Wyns et al.; PSPICE Simulations and 3D–PCB Transformers for ZVS Full Bridge Converters; The European Power Electronics Association; 1993: pp. 208–214.
EPE'93 Fifth European conference; Power Electronics and Applications; vol. 3: Electronic Power Supply System; Sep. 13–16, 1993; p. 215.
Davis; SMT Passive Components Fit Power Electronics Applications; PCIM; Jun., 1993; vol. 19; No. 6; pp. 20–28 and 90.
Osawa; A Superminiaturized Double–Balanced SMT Mixer–Modulator; Microwave Journal; Feb. 1994; pp. 90–97.
Lyons et al. ; Printed Circuit Board Magnetics; A New Approach to the Mass Production of Toroidal Transformers; ISHM '95 Proceedings; pp. 53–58.
Derebail et al.; Knowledge Based Adhesive Selection for SMT Assemblies; Proceedings 1995 International Symposium on Microelectronics; Oct. 14–26, 1995; vol. 2649; pp. 1024–1035.

* cited by examiner

*Primary Examiner*—Anh Mai
(74) *Attorney, Agent, or Firm*—Stephen E. Baldwin

(57) ABSTRACT

An electronic surface mount package provides a one piece construction package (with an open bottom) with one or more terminal pins molded into the package. Each of the pins have a notched post upon which a wire is wound which is from a toroid transformer carried within the package. Each of the posts are notched so their respective wires are separate from one another so as to prevent arcing. The case is opened at the bottom which prevents harm from expansion or cracking.

5 Claims, 5 Drawing Sheets

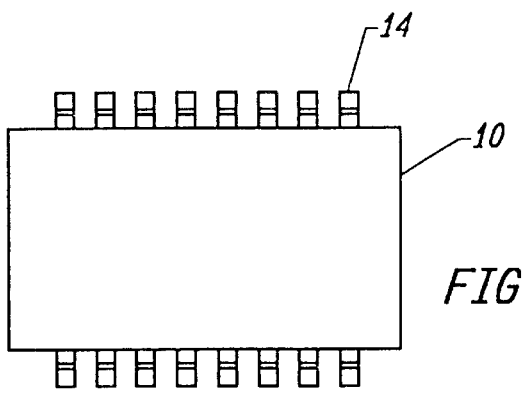
FIG. 9B
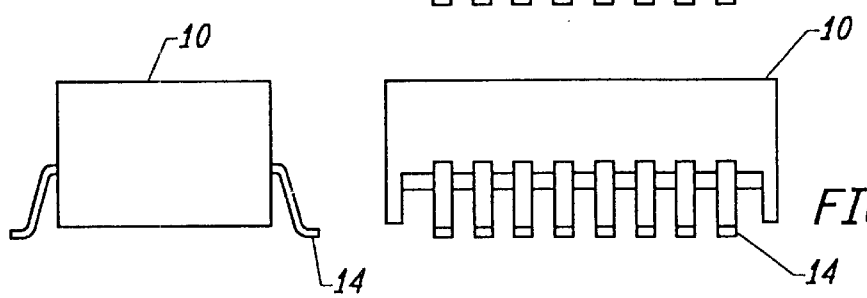
FIG. 9A
FIG. 9C
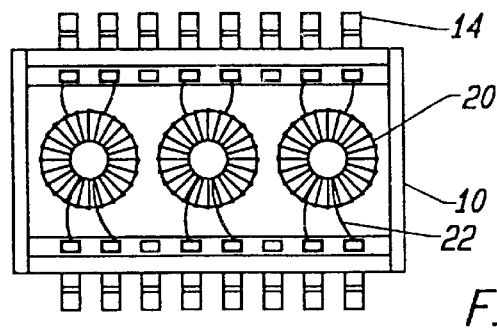
FIG. 9D

ELECTRONIC SURFACE MOUNT PACKAGE

This is a continuation of Ser. No. 08/906,952, filed Aug. 6, 1997 now U.S. Pat. No. 6,344,785.

BACKGROUND OF THE INVENTION

The present invention relates to an electronic surface mount package or case. Electronic surface mount packages are utilized in applications in which one or more individual toroid transformers are embodied within the surface mount package.

Wires coming off the transformers are electronically tied to pins on the package for connection to an electronic device. Typically, the electronic surface mount packages are mounted on a printed circuit board for utilization in the electronic device.

SUMMARY OF THE INVENTION

It is an object of the present invention to provide an improved electronic surface mount package.

Briefly, according to one preferred embodiment, the present invention provides a one piece construction package (with an open bottom) with one or more terminal pins molded into the package. Each of the pins have a notched post upon which a wire is wound which is from a toroid transformer carried within the package. Each of the posts are notched so that the respective wires are separated from one another so as to avoid arcing. The case is open at the bottom which prevents harm from expansion or cracking.

Other objects, features, and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the description, serve to explain the principles of the invention:

FIGS. 9A–9D show end, top, side, and bottom views of electronic surface mount package according to the present invention.

DETAILED DESCRIPTION OF THE DRAWINGS

Reference will now be made in detail to the preferred embodiments of the invention, examples of which are illustrated in the accompanying drawings, where like numerals indicate like components. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
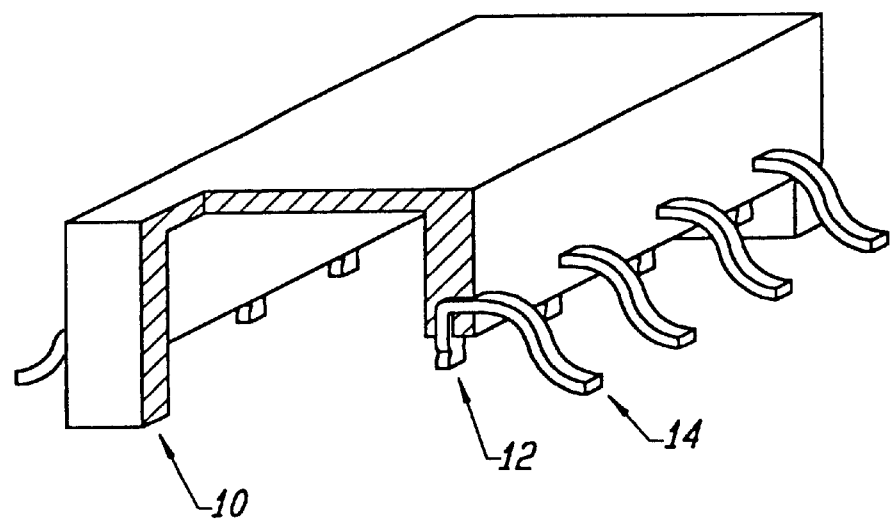
FIG. 1 shows an electronic surface mount package in three-dimensional view according to the present invention.

FIG. 1 shows an electronic surface mount transformer package or case 10 in three-dimensional view. FIG. 1 shows a cut-away of the generally rectangular empty case 10 with pins 14 molded into the case 10, together with notched post 12 upon which a wire is wound. Typically, tin-Lead plated copper alloy terminals are molded into the wall of the package 10. The outer portion of the package 10 is formed to meet specified footing requirements. The inner post 12 serves as a terminal for internal wire termination use. The package material is made of a type of thermal plastic which is in compliance with UL V-94 requirement for flammability.

Figure 2:
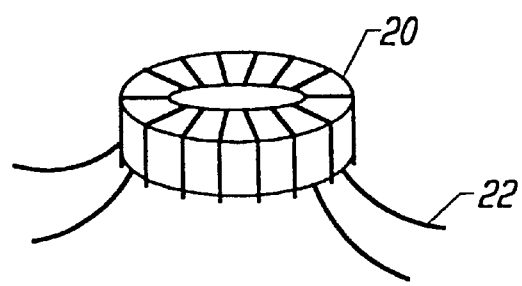
FIG. 2 shows a wound toroid transformer.

FIG. 2 shows a wound toroid transformer 20 with wire 22 wrapped around the transformer 20. The toroid core is typically made of ferrite or iron material and the winding of wire 22 is done manually with fine insulated magnet wire.

Figure 3:
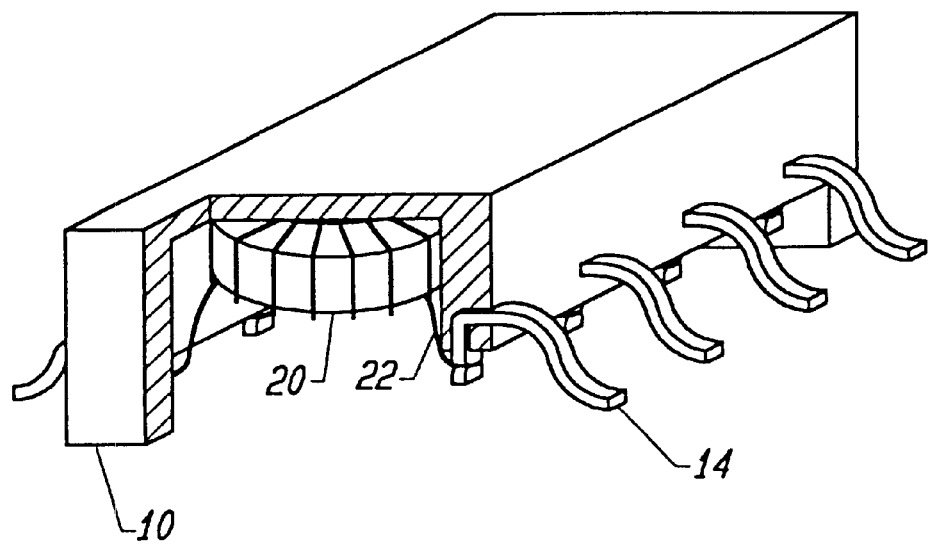
FIG. 3 shows the connection of the toroid transformer of FIG. 2 within the electronic surface mount package of FIG. 1.

FIG. 3 shows a cut-away of the molded part with the toroid 20 mounted inside and showing the wire 22 as it is then attached to post 14. The wires 22 are pulled with minimum tension and wrapped around the terminal post 14 for two to two and a half turns. This operation is done when the case has been placed bottom side up.

Figure 4:
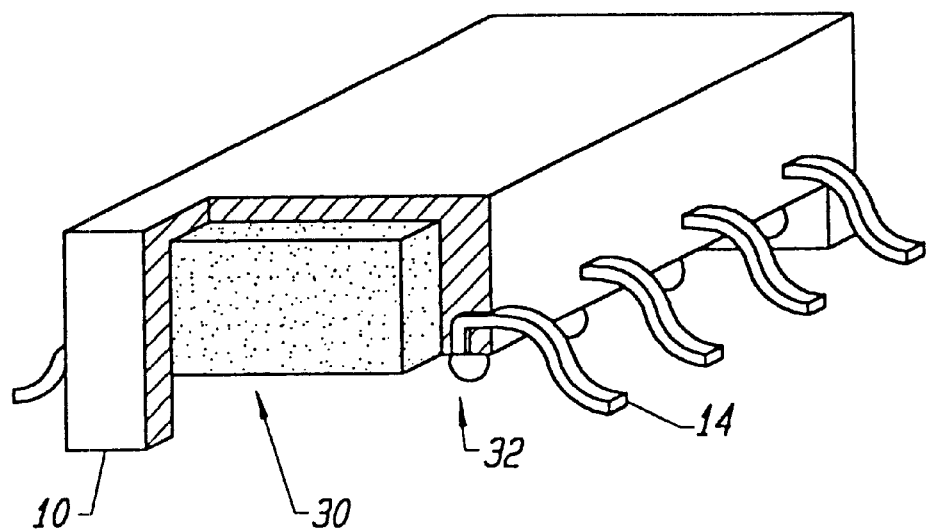
FIG. 4 shows the electronic surface mount package of FIG. 1 after wire terminations have been soldered.

FIG. 4 shows a silicon compound 30 poured inside the cavity with wire terminations that have been soldered with high temperature solder (95 Ag/5Sn) 32 and the package has been properly cleaned. The case 10 is then filled with soft silicone material to protect the transformer and to meet environmental requirements.

Figure 5:
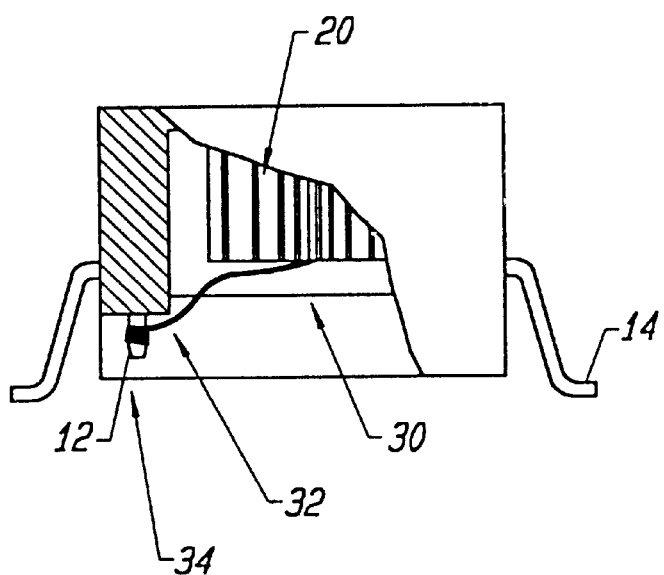
FIG. 5 and 6 show relationships between a safeguard (standoff) and the electronic surface-mount package's foot seating plane and inner terminal posts, respectively.
Figure 6:
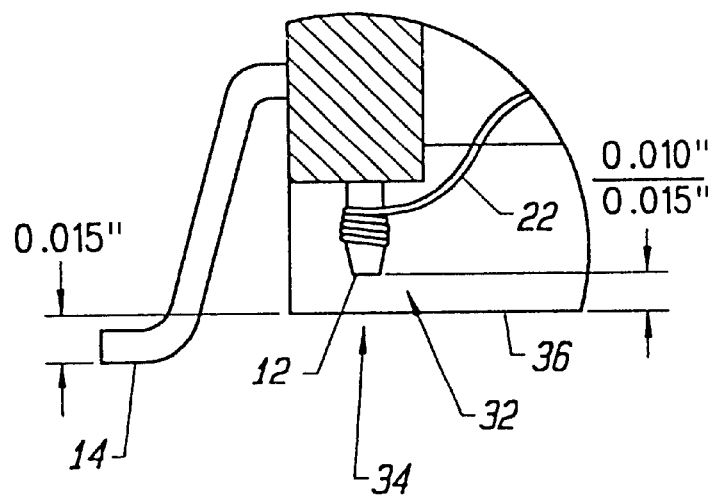

FIGS. 5 and 6 show the relationships between the safe guard (stand off) 34 and package's foot seating plane and inner terminal posts 12a. FIG. 5 shows the standoff 34, in which the parts typically are placed automatically by machine onto a PC board. They are pressed down, as,it is desirable to have some limitation of how far they can be pressed. It is also desirable that the post 12 does not touch the PC board, and so the end standoffs 34 do not allow that to happen.

FIG. 6 shows the distance in relationship between the end of the post 12 and where the PC board 36 is located and also where the standoff 34 ends. The PC board 36 would be at the base of the foot.

In FIG. 6, the typical clearance of 0.015 inches from the safe guard 34 to the seating plane is to avoid interference to the coplanarity of the package. There is also a gap between the safe guard 34 and terminal post 12 to prevent the solder joints from touching the circuit board due to an over forced pick and place operation.

Inside the package 10, there may be two, three, or more individual toroidal transformers. Wires coming off of the transformers are connected to the outside world. For example, the pins may be mounted on a printed circuit board in an electronic device. The lead frame pins are injection molded and the shape of the post upon which the wire is wound from the toroidal transformer is notched. This allows for the wires to be separated from pin to pin, and for soldering to be much more efficient.

Figure 7:
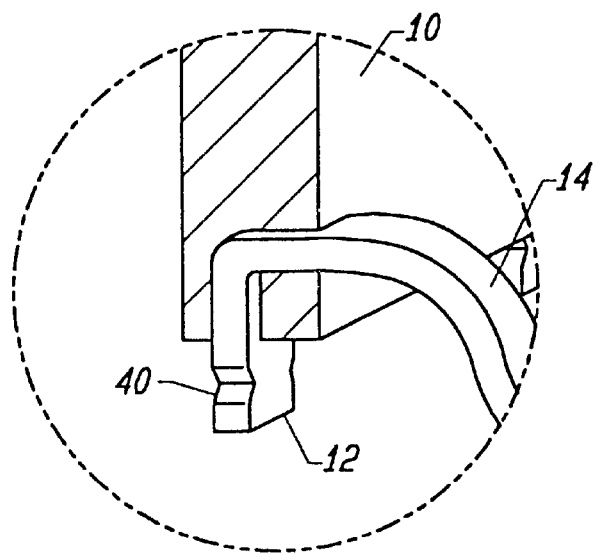
FIG. 7 shows a close-up of the pin configuration of FIG. 1 and how it is molded inside the wall of the body of the package.

FIG. 7 shows a closeup of the pin 12 and how pin 12 is molded inside the wall. of the body and also the notch effect 40 of the pin 12. The post 14 is notched so that the wires are kept away from one another (post to post) which is very desirable. The separation is desirable so as to avoid arcing.

Figure 8:
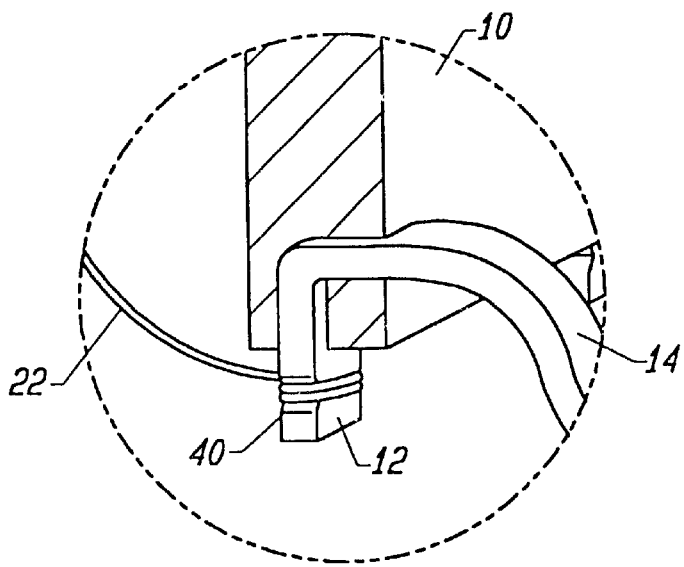
FIG. 8 shows wire wrapped around the pin or post of FIG. 7.

FIG. 8 shows the wire 22 wrapped around the pin or post 12.

FIGS. 9A–9D show end, top, side, and bottom views, respectively, of the electronic surface mount package 10. The embodiment shown in FIGS. 9A–9D provide an industrial standard surface mount footprint and package: dimensions which are auto pick and placeable. In addition, special design consideration has been applied to thermal expansion of materials to ensure that the package will stand all normal reflow processes with low cost, easy manufacturing, and high reliability.

In the industry, many manufacturers have used a two-piece construction, a base and a cover, and the case is backfilled with epoxy. In some processes, the coefficients of expansion of the epoxy that has been backfilled, plus the toroid itself, tend to cause the two pieces to separate. The base separates from the top, and as a result, it can end up cracking. The present invention provides a one-piece construction (an open bottom) only with the silicon filling to protect the toroid. The case is open at the bottom, thus allowing for nothing to expand or crack.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of making an electronic surface mount package, the method comprising the steps for:

forming a package having a side wall with a bottom end;

encapsulating a plurality of toroid transformers within the package with a resilient material;

molding a plurality of terminal pins within the side wall, each of the pins extending through the side wall and having a solder post end, each of the post ends extending beyond the bottom end of the side wall; and wrapping and soldering the wires from the transformers to the solder post ends for each of the pins.

2. The method of claim 1 wherein the resilient material is a soft silicone material.

3. A method of making an electronic surface mount package, the method comprising the steps for:

molding a one piece construction package having a side wall with a bottom end and a plurality of terminal pins within and extending from the bottom of the package;

encapsulating and carrying a plurality of toroid transformers within the package; and wrapping and soldering the wires from the transformers to an end of a solder post for each of the pins.

4. The method of claim 3 wherein the step for encapsulating and carrying the plurality of toroid transformers pours a resilient material into the package and subsequently sets the resilient material.

5. The method of claim 3 wherein the resilient material is a soft silicone material.

* * * * *

(12) EX PARTE REEXAMINATION CERTIFICATE (7520th)
United States Patent
Lu et al.

(10) Number: US 6,662,431 C1
(45) Certificate Issued: May 18, 2010

(54) ELECTRONIC SURFACE MOUNT PACKAGE

(75) Inventors: Peter Lu, Flower Mound, TX (US);
Jeffrey Heaton, Cupertino, CA (US);
James W. Heaton, Los Altos, CA (US);
Peter Loh Hang Pao, Kowloon (HK);
Robert Loke Hang Lam, Kowloon (HK); Tsang Kei Sun, Kowloon (HK)

(73) Assignee: Halo Electronics, Inc., Mountain View, CA (US)

Reexamination Request:
No. 90/009,142, May 5, 2008

Reexamination Certificate for:
Patent No.: 6,662,431
Issued: Dec. 16, 2003
Appl. No.: 10/072,309
Filed: Feb. 5, 2002

Related U.S. Application Data

(63) Continuation of application No. 08/906,952, filed on Aug. 6, 1997, now Pat. No. 6,344,785.

(51) Int. Cl.
*H01F 7/06* (2006.01)

(52) U.S. Cl. ............... 29/602.1; 29/606; 336/192
(58) Field of Classification Search .......... None
See application file for complete search history.

(56) References Cited

U.S. PATENT DOCUMENTS

| | | | |
|---|---|---|---|
| 3,353,124 A | 11/1967 | Dilger | |
| 3,721,747 A | * 3/1973 | Renskers | ............ 174/532 |
| 4,789,847 A | 12/1988 | Sakamoto et al. | |
| 4,930,200 A | 6/1990 | Brush, Jr. et al. | |
| 5,069,641 A | 12/1991 | Sakamoto et al. | |
| 5,212,345 A | * 5/1993 | Gutierrez | ............ 174/556 |
| 5,277,625 A | 1/1994 | Iannella et al. | |
| 5,309,130 A | 5/1994 | Lint | |
| 5,321,372 A | 6/1994 | Smith | |
| 5,337,028 A | 8/1994 | White | |
| 5,587,884 A | 12/1996 | Raman | |
| 5,805,431 A | 9/1998 | Joshi et al. | |
| 6,116,963 A | 9/2000 | Shutter | |
| 6,769,936 B2 | 8/2004 | Gutierrez et al. | |

FOREIGN PATENT DOCUMENTS

JP 07161535 * 6/1995

OTHER PUBLICATIONS

Harold Tischler, "Mounting and Packaging Techniques for Toroidal Devices", Proceedings of Electrical Electronics Insulation Conference and Electrical Manufacturing & Coil Winding Conference, Oct. 1993, pp. 261–262.*

Brad J. McCormick et al., "Surface Mount Transformers: A New Packaging Approach", Surface Mount Technology, Feb. 1993, pp. 27–31.*

Nano Pulse Industries, Catalog page for SMD 10BaseT Transformers, Jun. 1994.*

Nano Pulse Industries, Catalog page for Ethernet Isolation Transformers, Jun. 1994.*

* cited by examiner

*Primary Examiner*—Tuan H Nguyen

(57) ABSTRACT

An electronic surface mount package provides a one piece construction package (with an open bottom) with one or more terminal pins molded into the package. Each of the pins have a notched post upon which a wire is wound which is from a toroid transformer carried within the package. Each of the posts are notched so their respective wires are separate from one another so as to prevent arcing. The case is opened at the bottom which prevents harm from expansion or cracking.

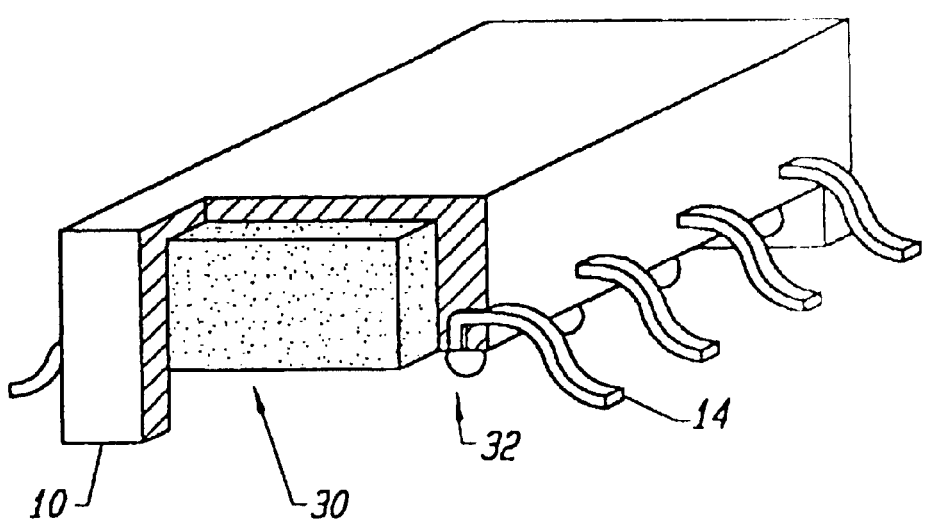

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–5 is confirmed.

New claims 6–14 are added and determined to be patentable.

6. *A method of making an electronic surface mount package, the method comprising the steps for:*

*molding a one piece construction package having a first side wall with a bottom end, an end wall substantially perpendicular to the first side wall, a second side wall substantially parallel to the first side wall, and a plurality of terminal pins within and extending from the bottom of the package and substantially parallel to the first side wall, wherein a portion of each of the terminal pins extends from and is substantially perpendicular to the first side wall, each of the terminal pins further including a lead for mounting onto a surface of a printed circuit board;*

*encapsulating and carrying a plurality of toroid transformers within the package; and*

*wrapping and soldering the wires from the transformers to an end of a solder post for each of the pins,*

*wherein at least a portion of the end wall extends below the solder posts, and the wires from the transformers are contained between first and second planes defined, respectively, by an outside surface of the first side wall and an outside surface of the second side wall.*

7. *The method of claim 6, wherein the portion of the end wall that extends below the post ends includes a central section of a lower surface of the end wall.*

8. *The method of claim 6, wherein the package is formed to have an open bottom.*

9. *The method of claim 6, wherein each of the terminal pins has a nonlinear portion disposed within the first side wall, and the nonlinear portion includes a first segment and a second segment substantially perpendicular to the first segment.*

10. *The method of claim 6, wherein the package further includes a resilient material to secure the plurality of toroid transformers within the package.*

11. *A method of making an electronic surface mount package, the method comprising the steps for:*

*molding a one piece construction package having a first side wall with a bottom end, a second side wall substantially parallel to the first side wall, and a plurality of terminal pins within and extending from the bottom of the package and substantially parallel to the first side wall, wherein a portion of each of the terminal pins extends from and is substantially perpendicular to the first side wall, each of the terminal pins further including a lead for mounting onto a surface of a printed circuit board;*

*encapsulating and carrying a plurality of toroid transformers within the package; and*

*wrapping and soldering the wires from the transformers to an end of a solder post for each of the pins,*

*wherein the wires from the transformers are contained between first and second planes defined, respectively, by an outside surface of the first side wall and an outside surface of the second side wall.*

12. *The method of claim 11, wherein the package is formed to have an open bottom.*

13. *The method of claim 11, wherein each of the terminal pins has a nonlinear portion disposed within the first side wall, and the nonlinear portion includes a first segment and a second segment substantially perpendicular to the first segment.*

14. *The method of claim 11, wherein the package further includes a resilient material to secure the plurality of toroid transformers within the package.*

\* \* \* \* \*